US008830441B2

(12) United States Patent
Cadee et al.

(10) Patent No.: US 8,830,441 B2
(45) Date of Patent: Sep. 9, 2014

(54) FLUID HANDLING STRUCTURE, A LITHOGRAPHIC APPARATUS AND A DEVICE MANUFACTURING METHOD

(75) Inventors: Theodorus Petrus Maria Cadee, Asten (NL); Raymond Wilhelmus Louis Lafarre, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 292 days.

(21) Appl. No.: 13/404,746

(22) Filed: Feb. 24, 2012

(65) Prior Publication Data

US 2012/0249982 A1 Oct. 4, 2012

Related U.S. Application Data

(60) Provisional application No. 61/447,447, filed on Feb. 28, 2011.

(51) Int. Cl.
 *G03B 27/52* (2006.01)
 *G03B 27/42* (2006.01)
 *G03F 7/20* (2006.01)

(52) U.S. Cl.
 CPC ................... *G03F 7/70341* (2013.01)
 USPC .............................. 355/30; 355/53

(58) Field of Classification Search
 CPC .................................. G03F 7/70341
 USPC ...................... 355/30, 53; 250/548
 See application file for complete search history.

(56) References Cited

U.S. PATENT DOCUMENTS

| 4,509,852 | A | 4/1985 | Tabarelli et al. |
| 7,057,702 | B2 | 6/2006 | Lof et al. |
| 7,193,681 | B2 * | 3/2007 | Hoogendam et al. ........... 355/30 |
| 8,456,610 | B2 * | 6/2013 | Hazelton et al. ................ 355/53 |
| 2004/0207824 | A1 | 10/2004 | Lof et al. |
| 2005/0286032 | A1 | 12/2005 | Lof et al. |
| 2006/0038968 | A1 | 2/2006 | Kemper et al. |
| 2007/0296939 | A1 | 12/2007 | Nishii |
| 2008/0002169 | A1 | 1/2008 | Hasegawa et al. |
| 2008/0212046 | A1 | 9/2008 | Riepen et al. |
| 2009/0002648 | A1 | 1/2009 | Poon et al. |
| 2009/0122283 | A1 | 5/2009 | Hasegawa |
| 2009/0237632 | A1 | 9/2009 | Direcks et al. |
| 2009/0279060 | A1 | 11/2009 | Direcks et al. |
| 2009/0279062 | A1 | 11/2009 | Direcks et al. |
| 2010/0157260 | A1 | 6/2010 | Knaapen et al. |

FOREIGN PATENT DOCUMENTS

| EP | 1 420 298 | 5/2004 |
| JP | 2005-019864 | 1/2005 |

(Continued)

OTHER PUBLICATIONS

Japanese Office Action mailed Mar. 4, 2013 in corresponding Japanese Patent Application No. 2012-026033.

*Primary Examiner* — Hung Henry Nguyen

(74) *Attorney, Agent, or Firm* — Pillsbury Winthrop Shaw Pittman LLP

(57) ABSTRACT

A fluid handling structure configured to supply immersion liquid to a space defined between a projection system and a facing surface facing the fluid handling structure, wherein the fluid handling structure has a main body with an undersurface, a moveable member moveable relative to the main body, and a self-regulating mechanism to maintain a gap of a certain size between a bottom surface of the moveable member and the facing surface independent of the size of a gap between the undersurface and the facing surface.

21 Claims, 5 Drawing Sheets

(56) References Cited

FOREIGN PATENT DOCUMENTS

| | | |
|---|---|---|
| JP | 2005-353820 | 12/2005 |
| JP | 2006-013502 | 1/2006 |
| JP | 2007-115730 | 5/2007 |
| JP | 02011018744 * | 7/2009 |
| JP | 2011-018744 | 1/2011 |
| WO | 99/49504 | 9/1999 |
| WO | 2007/129753 | 11/2007 |

* cited by examiner

-- PRIOR ART --

-- PRIOR ART --

-- PRIOR ART --

-- PRIOR ART --

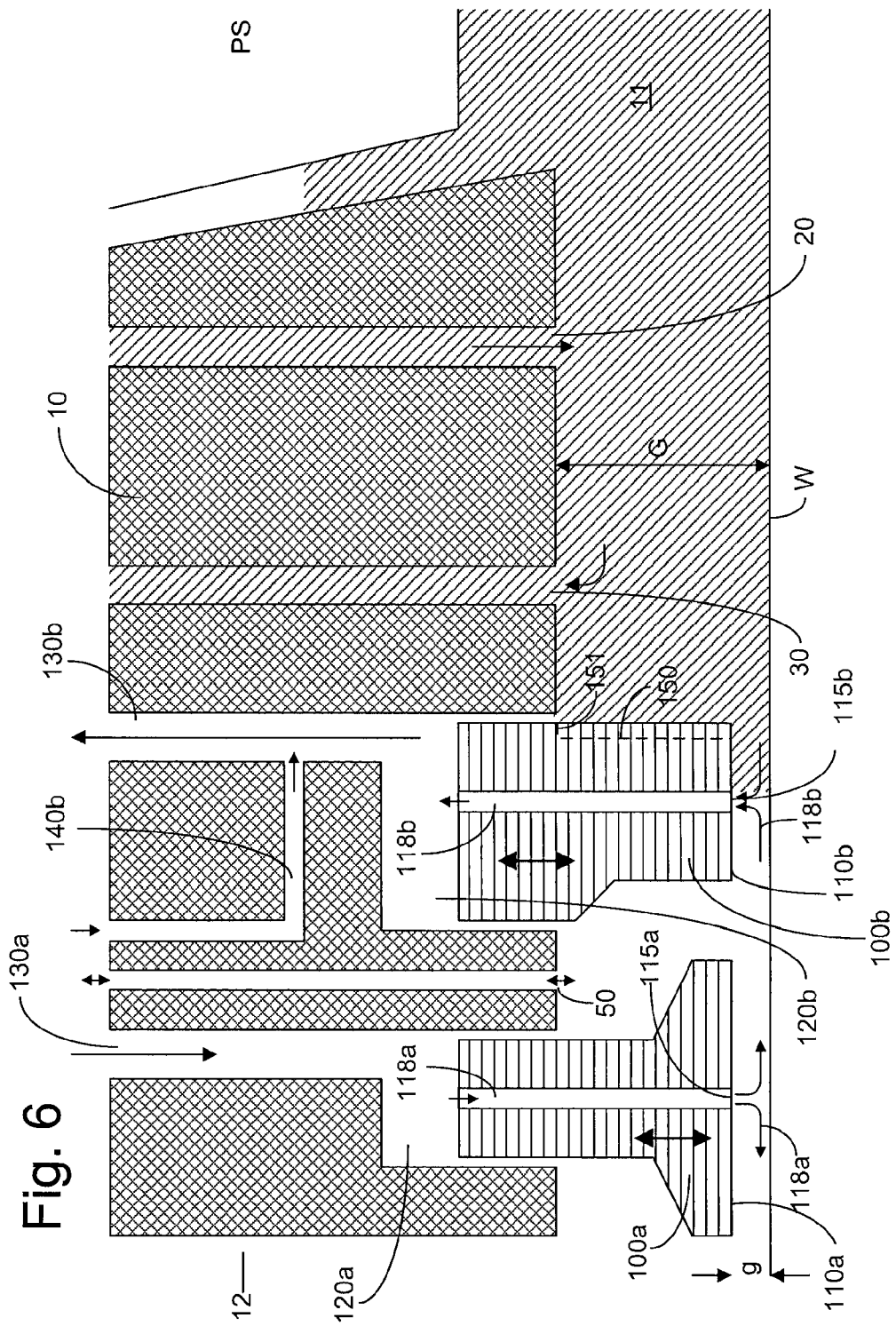

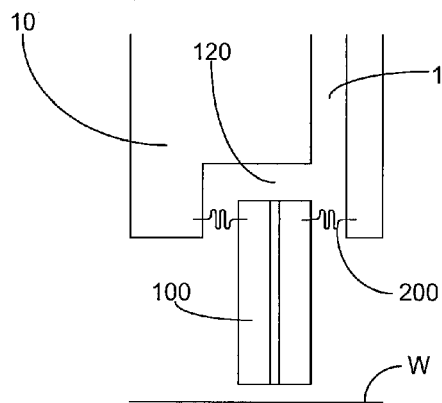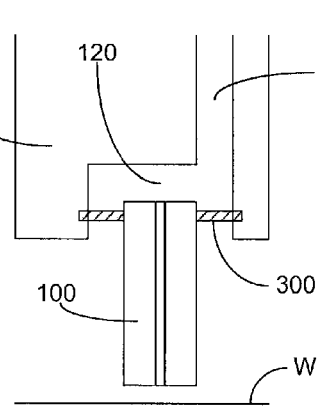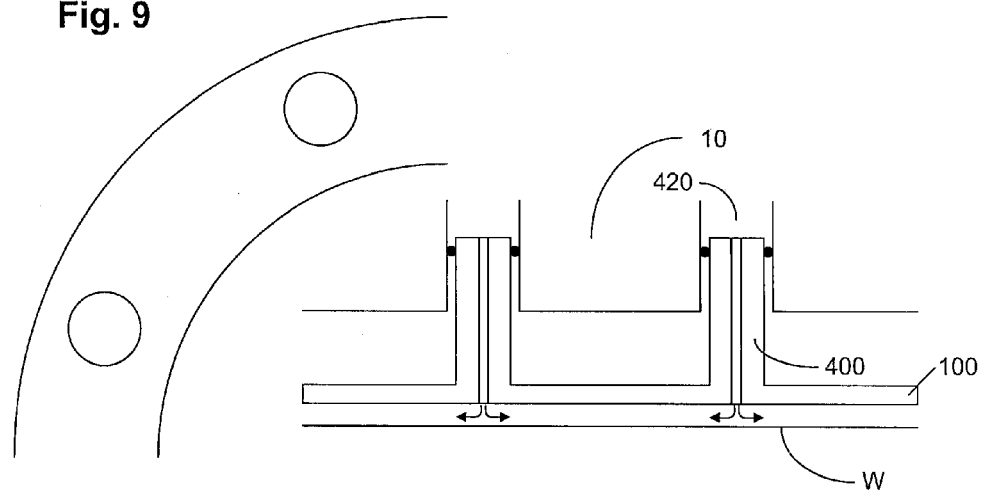

FLUID HANDLING STRUCTURE, A LITHOGRAPHIC APPARATUS AND A DEVICE MANUFACTURING METHOD

This application claims priority and benefit under 35 U.S.C. §119(e) to U.S. Provisional Patent Application No. 61/447,447, filed on Feb. 28, 2011. The content of that application is incorporated herein in its entirety by reference.

FIELD

The present invention relates to a fluid handling structure, a lithographic apparatus and a method for manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

If the immersion liquid is confined by a fluid handling system to a localized area on the surface which is under the projection system, a meniscus extends between the fluid handling system and the surface. If the meniscus collides with a droplet on the surface, this may result in inclusion of a bubble in the immersion liquid. The droplet may be present on the surface for various reasons, including because of leaking from the fluid handling system. A bubble in immersion liquid can lead to imaging errors, for example by interfering with a projection beam during imaging of the substrate.

The extraction of large amounts of gas and liquid may lead to a large thermal cooling load on a substrate. A large local cooling load may lead to a thermal difference on the surface of the substrate which may lead to overlay errors and is therefore undesirable.

It is desirable, for example, to provide a lithographic apparatus in which the likelihood of bubble inclusion is at least partly reduced and/or heat load due to evaporation is at least partly reduced.

According to an aspect, there is provided a fluid handling structure configured to supply immersion liquid to a space defined between a projection system and a facing surface facing the fluid handling structure, wherein the fluid handling structure comprises: a main body comprising an undersurface; a moveable member moveable relative to the main body; and a self-regulating mechanism to maintain a gap of a certain size between a bottom surface of the moveable member and the facing surface independent of the size of a gap between the undersurface and the facing surface.

According to an aspect, there is provided A device manufacturing method comprising: providing a fluid between a final element of a projection system and a substrate; and handling the fluid using a fluid handling structure comprising a main body with an undersurface and a moveable member which moves independently of the main body and relative to the main body through a self-regulating mechanism which maintains a gap of a certain size between a bottom surface of the moveable member and the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 depicts, in cross-section, a further liquid supply system for use in a lithographic projection apparatus;

FIGS. 8a and 8b depict, in cross-section, the connection between a moveable member and the main body of an embodiment; and FIG. 9 illustrates, in plan and cross-section, a plurality of recesses in the main body for protrusions of a moveable member.

DETAILED DESCRIPTION

Figure 1:
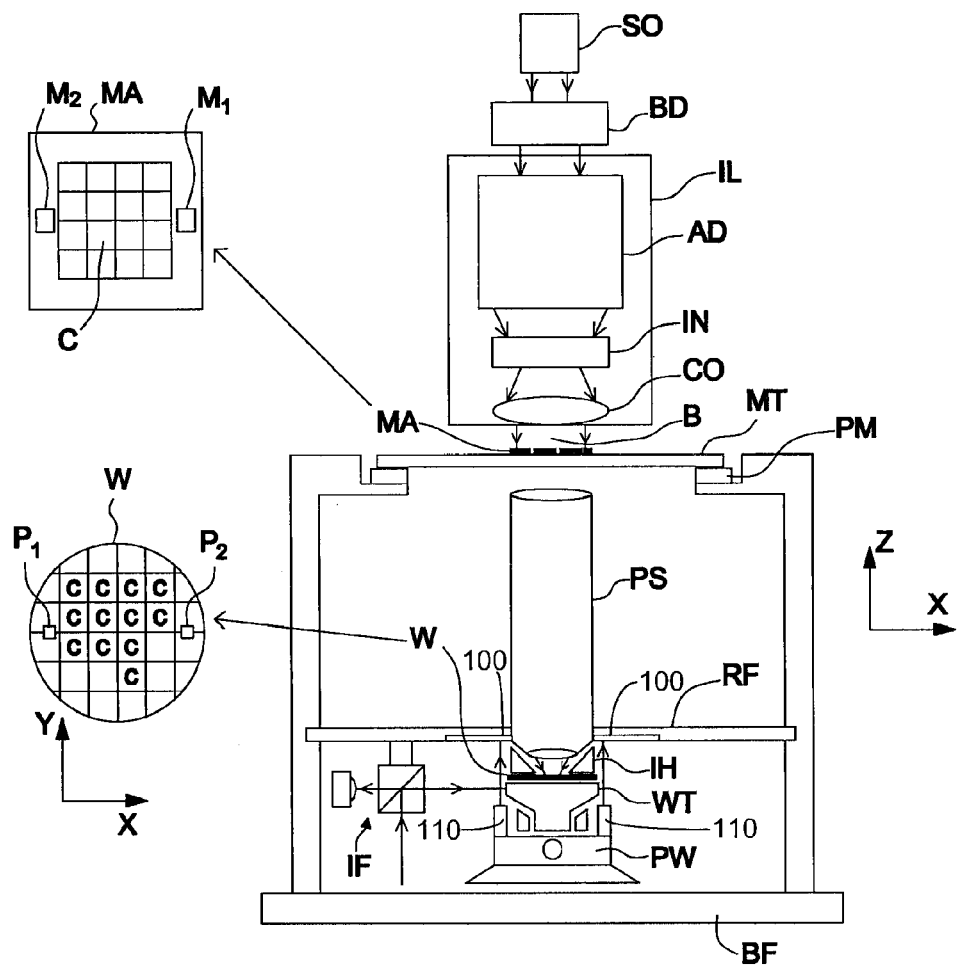
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a substrate table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof; as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, sensor and measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder 18, 19 or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2-7 show different supply devices which can be used in such a system. A sealing feature is present to seal liquid to the localized area. One way which has been proposed to arrange for this is disclosed in PCT patent application publication no. WO 99/49504.

In an all wet arrangement the liquid is unconfined. The whole top surface of the substrate and all or part of the substrate table is covered in immersion liquid. The depth of the liquid covering at least the substrate is small. The liquid may be a film, such as a thin film, of liquid on the substrate. Immersion liquid may be supplied to or in the region of a projection system and a facing surface facing the projection system (such a facing surface may be the surface of a substrate and/or a substrate table). Any of the liquid supply devices of FIGS. 2-5 can also be used in such a system. However, a sealing feature is not present, not activated, not as efficient as normal or otherwise ineffective to seal liquid to only the localized area.

Figure 2:
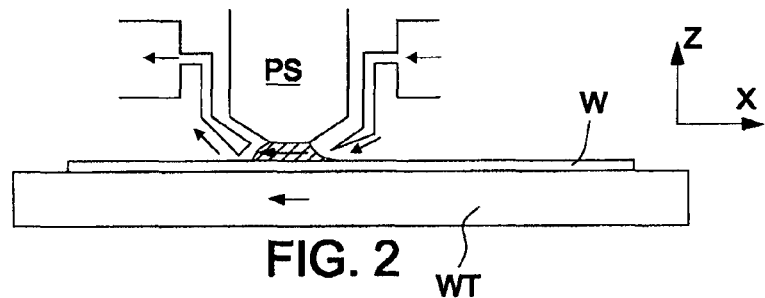
FIGS. 2 and 3 depict a liquid supply system for use in a lithographic projection apparatus.
Figure 3:
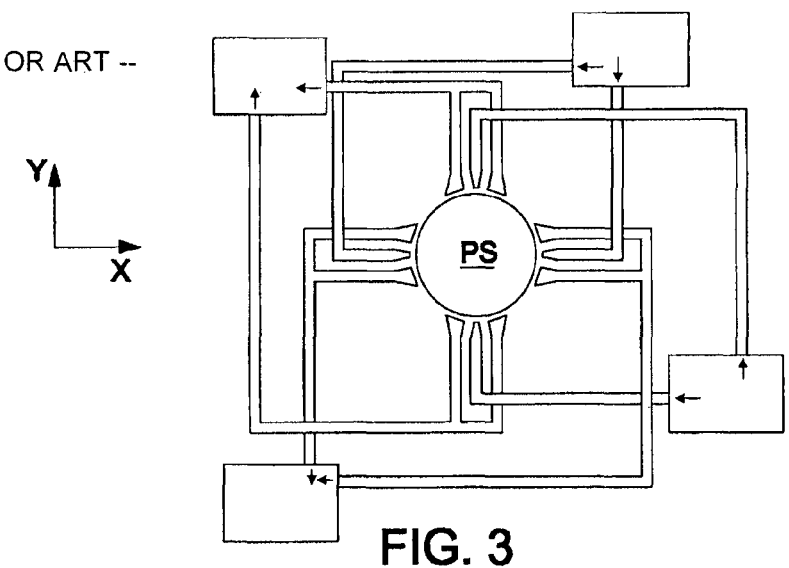

As illustrated in FIGS. 2 and 3, liquid is supplied by at least one inlet onto the substrate, preferably along the direction of movement of the substrate relative to the final element. Liquid is removed by at least one outlet after having passed under the projection system. As the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible; one example is illustrated in FIG. 3 in which four sets of an inlet with an outlet on either side are provided in a regular pattern around the final element. Note that the direction of flow of the liquid is shown by arrows in FIGS. 2 and 3.

Figure 4:
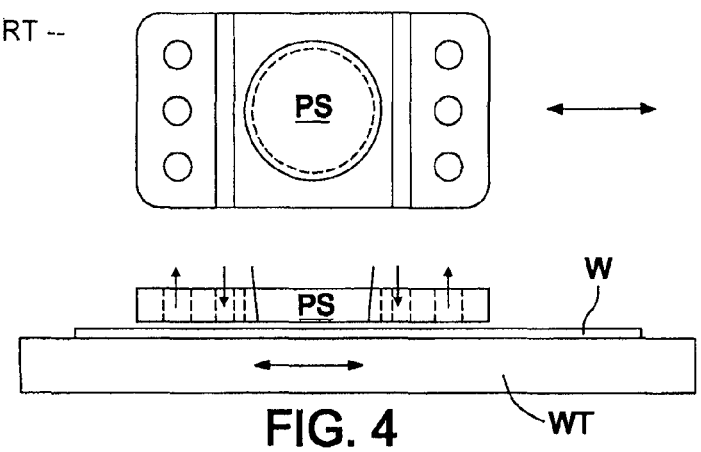
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that the direction of flow of fluid and of the substrate is shown by arrows in FIG. 4.

Another arrangement which has been proposed is to provide the liquid supply system with a liquid confinement structure which extends along at least a part of a boundary of the space between the final element of the projection system and the substrate table. Such an arrangement is illustrated in FIG. 5.

Figure 5:
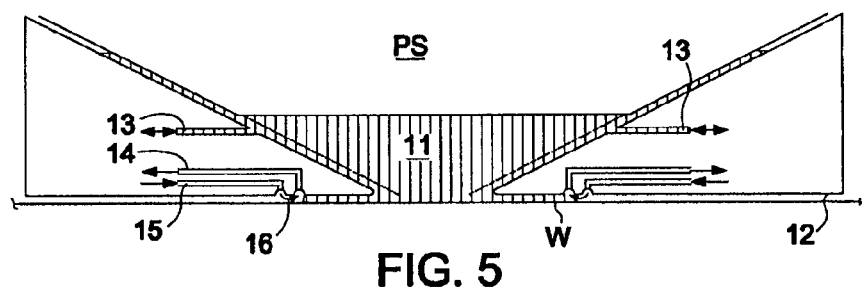
FIG. 5 depicts a further liquid supply system for use in a lithographic projection apparatus.

FIG. 5 schematically depicts a localized liquid supply system or fluid handling system with a liquid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The liquid confinement structure 12 is substantially stationary relative to the projection system in the XY plane though there may be some relative movement in the Z direction (in the direction of the optical axis). In an embodiment, a seal is formed between the liquid confinement structure 12 and the surface of the substrate W and may be a contactless seal such as a gas seal (such a system with a gas seal is disclosed in European patent application publication no. EP-A-1,420,298) or liquid seal.

The liquid confinement structure 12 at least partly contains liquid in the space 11 between a final element of the projection system PS and the substrate W. A contactless seal 16 to the substrate W may be formed around the image field of the projection system PS so that liquid is confined within the space between the substrate W surface and the final element of the projection system PS. The space 11 is at least partly formed by the liquid confinement structure 12 positioned below and surrounding the final element of the projection system PS. Liquid is brought into the space below the projection system PS and within the liquid confinement structure 12 by liquid inlet 13. The liquid may be removed by liquid outlet 13. The liquid confinement structure 12 may extend a little above the final element of the projection system. The liquid level rises above the final element so that a buffer of liquid is provided. In an embodiment, the liquid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the liquid confinement structure 12 and the surface of the substrate W. The gas seal is formed by gas. The gas in the gas seal is provided under pressure via inlet 15 to the gap between liquid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the liquid confinement structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824, which is hereby incorporated by reference in its entirety. In an embodiment, the liquid confinement structure 12 does not have a gas seal.

FIG. 6 shows a liquid confinement structure, in cross-section. As with the liquid confinement structure of FIG. 5, the liquid confinement structure 12 of FIG. 6 surrounds the projection system PS. The liquid confinement structure 12 is configured to supply immersion liquid to a space 11 defined between the projection system PS and a facing surface (for example a substrate W), facing the liquid confinement structure 12.

The liquid confinement structure 12 comprises a main body 10 and at least one moveable member 100a, 100b. The at least one moveable member 100a, 100b is moveable relative to the main body 10. In an embodiment the main body 10 is mounted substantially stationary relative to the projection system PS both in the X/Y direction as well as in the Z direction (the direction of the optical axis of the projection system PS). The main body 10, in an embodiment, is fixed in the Rx, Ry, Rz degrees of freedom relative to the projection system PS.

The moveable members 100a, 100b extend all around the optical axis of projection system PS. In an embodiment an inner surface of an inner movable member 100b defines an edge of the space 11.

The moveable members 100a, 100b are configured to be self regulating in that they automatically maintain a certain gap g between their bottom surface 110a, 110b and the facing surface (e.g. the substrate W). The moveable members 110a, 110b (of which there may be any number, including only one) may not all be configured to have the same gap g as each other. In an embodiment the gap g is greater than 1 μm. In an embodiment the gap is below 100 μm or 50 μm. Typically the gap g is around 20 μm, say above 10 μm and/or below 30 μm. The selected range is dependent upon the roughness of the surface which the moveable member 100a, 100b follows and the relative velocity between the moveable member 100a, 100b and the surface. A gap g of less than 10 μm is only possible with flat substrates, substrate tables, etc. with low scan speeds. A more realistic gap g is several 10's of μm.

The gap g is maintained as the substrate W moves under the projection system PS. In this way the moveable members 100a, 100b follow the undulations in the surface of the facing surface and move up and down relative to the main body 10. Therefore the gap g is substantially constant in use. This compares to the gap G between an undersurface 25 of the main body 10 and the facing surface (e.g. substrate W).

Although in an embodiment the main body 10 may be actuated to move relative to the projection system PS, in use, this need not be the case and if it is the case the movement need not be such that the gap G remains constant. This is because of the sealing function of the inner moveable member 100b which maintains a substantially constant gap g between its bottom surface 110b and the substrate W. The gap G may be of the order of 150 μm or greater (for example of the order of 1 or several mm) which is typical for a liquid confinement structure. In one embodiment the gap G is kept substantially constant. In one embodiment the gap G is dictated by the design of the projection system PS. This is possible because the gap G has no part in sealing the immersion liquid in the space 11, contrary to prior designs. In one embodiment the gap G is greater than 0.5 mm and desirably is fixed.

Droplets which are larger than the gap g and not in space 11 will collide with a moveable member 100a, 100b rather than with the meniscus extending between the liquid confinement structure 12 (e.g. between the moveable member 100b) and the substrate W. As a result, liquid impacting on that meniscus will comprise relatively small droplets (with a diameter smaller than distance g). Bubbles which are included into the liquid in the space 11 as a result of collision of the small droplets with the meniscus thus may not pose a defectivity risk (a defectivity risk may be only present for droplets with a diameter greater than 50 μm colliding with the meniscus).

Each of the moveable members 100a, 100b is provided with a self-regulating mechanism. The self-regulating mechanism maintains the gap g to be a certain size during use, independent of the size of gap G. In an embodiment, the self regulating mechanism does not make use of a sensor and actuator in a feedback or feedforward manner. Instead the regulator provides a mechanism whereby a force on the moveable member 100a, 100b varies with the distance from the facing surface. The gap g varies until that force is balanced by a biasing force between the moveable member 100a, 100b and the main body 10. In this way a self balancing mechanism may be realized.

In an embodiment, such as that illustrated in FIG. 6, the self-regulating mechanism includes at least one opening 115a, 115b in the bottom surface 110a, 110b of the moveable member for the passage therethrough of a fluid. Flow of fluid through the opening 115a, 115b creates an overpressure (in the case of moveable member 100a) or an underpressure (in the case of moveable member 100b) between the bottom surface 110a, 110b and the substrate W.

The presence of an overpressure or underpressure generates a force on the moveable member 100a, 100b. Because the overpressure or underpressure generated depends upon the site of the gap g between the bottom surface 110a, 110b and the substrate W at substantially constant flow rate, the force on the moveable member 100a, 100b varies according to the distance of the bottom surface 110a, 110b from the substrate W.

The self-regulating mechanism can make use of this variation in force according to the size of gap g by providing a biasing mechanism to apply a force to the moveable member 100a, 100b in the opposite direction to the force generated by the overpressure or underpressure. In this way, the self-regulating mechanism can be arranged so that an equilibrium position of the moveable member 100a, 100b is a certain distance g from the facing surface.

Part of the biasing mechanism comprises gravity acting on the moveable member 100a, 100b. As will be described below with reference to FIG. 6, in an embodiment, part of the biasing mechanism comprise an underpressure or overpressure in a chamber 120a, 120b defined by walls of the main body 10 and a surface of the moveable member 100a, 100b. Other embodiments of biasing mechanism are described with reference to FIGS. 8 and 9 below.

The embodiment of FIG. 6 comprises two movable members 100a, 100b. However, an embodiment of the present invention can be used with any type of liquid confinement structure and can comprise any number of moveable members 100a, 100b.

In the embodiment of FIG. 6, an inner movable member 100b forms a barrier to the space 11 with inner surface 115b.

In an embodiment the inner movable member 100b forms a seal between the moveable member 100b and the substrate W. The seal is formed due to the small distance g between the bottom surface 110b of the moveable member 100b and the substrate W. The presence of opening 115b improves the seal.

The opening 115b is an inlet for the passage of fluid from outside the moveable member into the moveable member 100b. The fluid may be a mixture of gas and liquid. For example, liquid from the space 11 which does find its way into the gap g between the moveable member 100b and the substrate W may be removed through the inlet 115b. Additionally, gas radially outwardly of the moveable 100b may be sucked out through the inlet 115b. The passage of gas radially inwards helps block the passage of liquid radially outward of the inlet 115b. The passage of gas radially inwards generates a force on the moveable member 100b towards the substrate W. That is, the flow of gas into the inlet 115b generates an underpressure which applies a force onto the moveable member 100b towards the facing surface.

Radially outward of the moveable member 100b is the moveable member 100a. The moveable member 100b includes an outlet 115a for the passage of gas out of the moveable member 100a. The outlet 115a may be in the form of a gas knife. Gas exiting the outlet 115a moves radially inwardly and outwardly as illustrated by arrows 118a of the outlet 115a. This movement of gas creates an overpressure between the bottom surface 110a of the moveable member 100a and the substrate W. This generates a force on the moveable member 100a away from the facing surface (e.g. substrate W).

The outlet 115a and inlet 115b may be provided as a slit extending around the entire periphery of the bottom surface 110b of the moveable member 100. In an embodiment a plurality of channels fluidly connect the slit with the chamber 120. Alternatively, the outlet 115a and inlet 115b may be provided as a series of discrete holes in a line, potentially connected together by a groove.

A moveable member 100a comprising a gas knife as illustrated in FIG. 6 may in particular be used in any type of liquid confinement structure 12 in which a gas knife is used radially outwardly of a meniscus pinning feature. For example, the moveable member 100a may be used to provide the gas knife in a so called gas drag principle liquid confinement structure (see for example United States patent application publication nos. US 2008-0212046, US 2009-0279060 and US 2009-0279062, the contents of each of which is hereby incorporated in their entirety by reference). In that system a plurality of extraction holes in the undersurface of the liquid confinement structure 12 are arranged in a shape, in plan, which may desirably have a corner. The corner may be aligned with a desired direction of movement, such as the stepping or the scanning direction. This reduces the force on the meniscus between two openings in the surface of the liquid confinement structure for a given speed in the desired direction compared to if the two outlets were aligned perpendicular to the desired direction. However, an embodiment of the invention may be applied to a liquid confinement structure which in plan has any shape, or has a component such as the extraction openings arranged in any shape. Such a shape in a non-limiting list may include an ellipse such as a circle, a rectilinear shape such as a rectangle, e.g. a square, or a parallelogram such as a rhombus or a cornered shape with more than four corners such as a four or more pointed star.

In such an embodiment an advantage lies in the moveable member breaking up large droplets of liquid on the substrate W which might otherwise collide with the meniscus of liquid extending between the under surface of the liquid confinement structure 12 and the substrate W.

An advantage of having the gas knife mounted on a moveable member 110a is that due to the self regulating mechanism the gap g between the outlet 115a of the gas knife and the facing surface can be kept small such that the flow of gas out of the gas knife is more intensive thereby substantially completely evaporating any liquid left on the facing surface and leaving the surface dry radially outwardly of the liquid confinement structure 12.

In an embodiment only the inner moveable member 100b illustrated in FIG. 6 is present. That is, a gas knife radially outwardly of the moveable member 100b which comprises the inlet 115b is not present or any gas knife radially outwardly of the moveable member 100b is fixed relative to the main body 10.

In an embodiment, as illustrated in FIG. 6, an opening 50 is provided in the under surface 25 of the main body 10 which is open to the atmosphere. Gas can flow either way through the opening 50 and this can help in balancing the gas flows into the inlet 115b and out of the outlet 115a.

Figure 7:
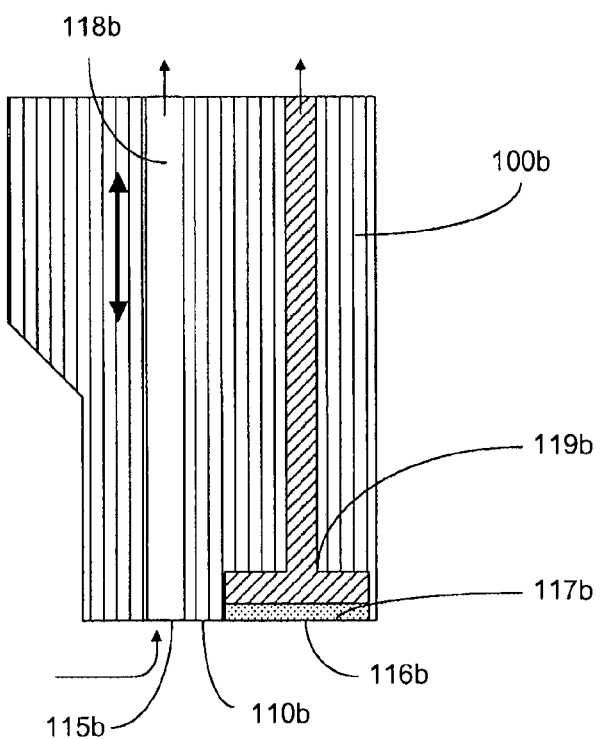
FIG. 7 depicts, in cross-section, a moveable member in accordance with an embodiment.

In an embodiment, as illustrated in FIG. 6, the biasing mechanism makes use of the gas flow through the openings 115a, 115b in the bottom surface 110a, 110b of the respective moveable member 100a, 100b. As will be appreciated, the biasing mechanism may be provided in any other way, such as illustrated in FIGS. 7 and 8, for example.

In FIG. 6, chambers 120a, 120b are provided in the main body 10 above respective moveable members 100a, 100b. In the case of chamber 120a associated with the outer moveable member 100a, an overpressure is generated in the chamber 120a due to the flow of gas through a supply passageway 130a into the chamber 120a before it passes into a passageway 119a in the moveable member 110a which passageway 119a leads to the outlet 115a. The geometry of the chamber 120a, the moveable member 100a, the passageway 119a and outlet 115a as well as the flow rate of gas is adjusted so that the force downwards on the moveable member 100a due to the pressure of gas in chamber 120a is balanced by the upward force on the moveable member 100a due to the gas flow 118a, at a certain gap size g.

In the embodiment of FIG. 6 the moveable members 100 are freely moving in the chambers 120.

The gap between the sides of the moveable member 100a and the side of chamber 120a may be small enough substantially to prevent leakage of gas. Alternatively an o-ring, v-seal or lip seal, for example, may block any gap.

The mechanical fit of the moveable member 100a into the chamber 120a (in the same way as the mechanical fit of the moveable member 100b in the chamber 120b) results in the moveable member 100a having a relatively low stiffness to the body 10 in the Rx, Ry and Z degrees of freedom. This allows the moveable member 100a to follow the surface of the substrate W as the substrate W moves under the liquid confinement structure 12 in the Z, Rx and Ry directions. Conversely, the moveable member 100a is positioned by the mechanical fit relative to the main body 10 in the X, Y and Rz degrees of freedom.

It can be seen that the moveable member 100a acts like a gas bearing that is flexible in the Rx, Ry and Z directions to follow the surface of the substrate W.

For the radially inward moveable member 100b, a flow of gas out of a passageway 130b connected to the chamber 120b above the moveable member 100b creates a underpressure in the chamber 100b which imparts a force on the moveable member 100b away from the substrate W. This force is balanced by the attractive force towards to substrate W due to the flow 118b. As illustrated, in an embodiment, a passageway 140b connected between the atmosphere and the passageway 130b is provided. The purpose of the passage 140b is to even out the flow through the passage 119b.

In an embodiment, as illustrated in FIG. 6, a liquid outlet 20 is provided radially inwardly of a liquid inlet 30 to provide/extract liquid between the undersurface 25 and the facing surface (e.g. substrate W). Additional inlets and/or outlets may be provided particularly for filling with liquid/retrieving liquid from the area under the projection system PS.

In an embodiment, the inner moveable member 100b which seals the space 11 has a stepped arrangement as illustrated in dashed line 150. That is, the side nearest to the center of the space 11, has a downwardly facing surface 151 other than the bottom surface 110b with which the liquid in the space 11 is in contact. This forms a safety feature so that in the event of an excessive increase in the pressure in the liquid in the space 11 (perhaps caused by a crash situation) the liquid pressure in the space 11 acting on the downwardly facing surface 151 would force the moveable member 100b upwards allowing liquid out of the space 11 underneath to reduce the pressure.

In a variation of the embodiment in FIG. 6, two inlets 115b may be provided in the bottom surface 110b of the moveable member 100b. A radially inward inlet 115b may be for the passage of liquid and a radially outward inlet may be for the passage of gas. In one embodiment, as illustrated in FIG. 7, a radially inward inlet 116b may be covered by a porous member 117b above which a chamber 119b may be provided. The radially inward inlet 116b is a single phase extractor assembly. The single phase extractor may comprise a liquid removal device, extractor or inlet such as the one disclosed in United States patent application publication no. US 2006-0038968, incorporated herein in its entirety by reference. In an embodiment, the liquid removal device comprises an inlet which is covered in a porous material 117b which is used to separate liquid from gas to enable single-liquid phase liquid extraction. An under pressure in chamber 119b is chosen is such that the meniscuses formed in the holes of the porous material 117b substantially prevent ambient gas from being drawn into the chamber 119b of the liquid removal device. However, when the surface of the porous material 117b comes into contact with liquid there is no meniscus to restrict flow and the liquid can flow freely into the chamber 119b of the liquid removal device.

The porous material 117b has a large number of small holes each with a dimension, e.g. a width, such as a diameter, in the range of 5 to 50 micrometers. The porous material 117b may be maintained at a height in the range of 50 to 300 micrometers above a surface, such as a facing surface, from which liquid is to be removed, e.g. the surface of a substrate W. In an embodiment, porous material 117b is at least slightly liquidphilic, i.e. having a dynamic contact angle of less than 90°, desirably less than 85° or desirably less than 80°, to the immersion liquid, e.g. water.

An advantage of an embodiment of the present invention is that a substantially constant force is provided onto the substrate W because the biasing mechanism is balanced when a substantially constant force due to the gas flows between the moveable members 100, 100b and the substrate W is achieved. This compares to prior liquid confinement structures in which the force applied by the liquid confinement structure onto the substrate can vary. This has an advantage in improving focusing performance.

Because the gap g is smaller than in prior liquid confinement systems the thickness of liquid left behind on the substrate W is much thinner. As a result, when this liquid evaporates (for example due to the flow 118a or 118b), the evaporation load is much lower than in prior liquid confinement structures.

The self regulating nature of the moveable members 100a results in the moveable member 100a, 100b following height differences of the substrate. For example, if there is a bump in the substrate W, the moveable member 100a, 100b is pushed upwards. This helps prevent mechanical contact between the liquid confinement structure 12 and the substrate W, and in this way damage is prevented.

FIGS. 8a and 8b illustrate embodiments in which the biasing force is provided by an elastic member. In the embodiment of FIG. 8a, a bellow 200 extends between the moveable member 100 and the main body 10. In the embodiment of FIG. 8b, a rectangular cross-section o-ring 300 is fixed at the radially inward side to the moveable member 100 and at the radially outward side to the main body 10. In both the FIG. 8a and FIG. 8b embodiments the biasing force is provided by the elasticity of the seal. That is, when the moveable member 100 is displaced, the elastic seal deforms and thereby applies a force on the moveable member 100. The elastic member 200, 300 does not suffer hysteresis, friction or undesired leakage and does not generate parasitic forces.

FIG. 9 illustrates a further embodiment in which the moveable member 100, rather than comprising a complete ring, and the chamber 120, rather than comprising a complete recess, are actually provided as a plurality of discrete recesses 420 and protrusions 400 at local positions around the periphery of the liquid confinement structure 12. In the embodiment of FIG. 9 the discrete protrusions 400 on the moveable member 100 and discrete chambers 420 in the body are illustrated as being circular in cross-section, though this not necessarily the case and other cross-sections may be used.

In an embodiment there is provided a fluid handling structure configured to supply immersion liquid to a space defined between a projection system and a facing surface facing the fluid handling structure. The fluid handling structure comprises a main body, a moveable member and a self-regulating mechanism. The main body comprise an undersurface. The moveable member is moveable relative to the main body. The self-regulating mechanism is to maintain a gap of a certain size between a bottom surface of the moveable member and the facing surface independent of the size of a gap between the undersurface and the facing surface.

The self-regulating mechanism may include an opening in the bottom surface for the passage therethrough of a fluid.

In use, the moveable member may be constructed and arranged such that the flow of fluid through the opening creates an underpressure or overpressure between the bottom surface and the facing surface thereby generating a force on the moveable member which varies according to the distance of the bottom surface from the facing surface. The opening may be an inlet for the passage of fluid from below the moveable member into the moveable member. The inlet may be for gas and liquid. The inlet may be for gas.

The fluid handling structure may further comprise a further opening in the bottom surface to extract liquid so that the opening is primarily to extract gas. The further opening may be for single phase extraction of liquid from the facing surface. The opening may be an outlet for the passage of gas out of the moveable member. The outlet may be an outlet of a gas knife.

The self-regulating mechanism may include a biasing mechanism to apply a force between the main body and the moveable member towards or away from the facing surface. The biasing mechanism may comprise gravity acting on the moveable member. The biasing mechanism may comprise an underpressure or overpressure in a chamber defined by walls of the main body and a surface of the moveable member.

The biasing mechanism may comprise an elastic element fixed to the main body and the moveable member and configured to generate at least a component of the biasing force. The elastic element may comprise a bellows.

The moveable member may include an inner surface which defines a boundary of the space.

The fluid handling structure may further comprise a further moveable member radially inward or outward of the moveable member.

The moveable member may surround the space.

The fluid handling structure may further comprise radially inward of the moveable member, an inlet opening in the under surface of the main body to provide immersion liquid to the space and/or an outlet opening in the under surface of the main body to recover immersion liquid from the space.

In an embodiment there is provided an immersion lithographic apparatus comprising a projection system and the above mentioned fluid handling system. The projection system is to project a beam of radiation onto a substrate supported by a substrate table. The above mentioned facing surface may be the surface of the substrate and/or a surface of the substrate table.

In an embodiment there is provided a device manufacturing method comprising providing a fluid between a final element of a projection system and a substrate. The method further comprises handling the fluid using a fluid handling structure comprising a main body with an undersurface and a moveable member which moves independently of the main body and relative to the main body through a self-regulating mechanism which maintains a gap of a certain size between a bottom surface of the moveable member and the substrate.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling structure configured to supply immersion liquid to a space defined between a projection system and a facing surface facing the fluid handling structure, wherein the fluid handling structure comprises:

a main body comprising an undersurface and a recess;
a moveable member moveable relative to the main body and located in the recess, the moveable member in the recess being laterally surrounded by the main body; and
a self-regulating mechanism to maintain a gap of a certain size between a bottom surface of the moveable member and the facing surface independent of the size of a gap between the undersurface and the facing surface.

2. The fluid handling structure of claim 1, wherein the self-regulating mechanism includes an opening in the bottom surface for the passage therethrough of a fluid.

3. The fluid handling structure of claim 2, wherein, in use, the moveable member is constructed and arranged such that the flow of fluid through the opening creates an underpressure or overpressure between the bottom surface and the facing surface thereby generating a force on the moveable member which varies according to the distance of the bottom surface from the facing surface.

4. The fluid handling structure of claim 3, wherein the opening is an inlet for the passage of fluid from below the moveable member into the moveable member.

5. The fluid handling structure of claim 4, wherein the inlet is for gas and liquid.

6. The fluid handling structure of claim 4, wherein the inlet is for gas.

7. The fluid handling structure of claim 4, further comprising a further opening in the bottom surface to extract liquid so that the opening is primarily to extract gas.

8. The fluid handling structure of claim 3, wherein the opening is an outlet for the passage of gas out of the moveable member.

9. The fluid handling structure of claim 8, wherein the outlet is an outlet of a gas knife.

10. The fluid handling structure of claim 1, wherein the self-regulating mechanism includes a biasing mechanism to apply a force between the main body and the moveable member towards or away from the facing surface.

11. The fluid handling structure of claim 10, wherein the biasing mechanism comprises gravity acting on the moveable member.

12. The fluid handling structure of claim 10, wherein the biasing mechanism comprises an underpressure or overpressure in a chamber defined by walls of the main body and a surface of the moveable member.

13. The fluid handling structure of claim 10, wherein the biasing mechanism comprises an elastic element fixed to the main body and the moveable member and configured to generate at least a component of the biasing force.

14. The fluid handling structure of claim 13, wherein the elastic element comprises a bellows.

15. The fluid handling structure of claim 1, wherein the moveable member includes an inner surface which defines a boundary of the space.

16. The fluid handling structure of claim 1, further comprising a further moveable member radially inward or outward of the moveable member.

17. The fluid handling structure of claim 1, wherein the moveable member surrounds the space.

18. The fluid handling structure of claim 1, further comprising, radially inward of the moveable member, an inlet opening in the under surface of the main body to provide immersion liquid to the space and/or an outlet opening in the under surface of the main body to recover immersion liquid from the space.

19. An immersion lithographic apparatus comprising:
a projection system to project a beam of radiation onto a substrate supported by a substrate table; and a fluid handling structure according to claim 1, wherein the facing surface is the surface of the substrate and/or a surface of the substrate table.

20. A device manufacturing method comprising:

providing a fluid between a final element of a projection system and a substrate; and handling the fluid using a fluid handling structure comprising a main body with a recess and a moveable member, located in the recess and laterally surrounded by the main body, which moves independently of the main body and relative to the main body through a self-regulating mechanism which maintains a gap of a certain size between a bottom surface of the moveable member and the substrate.

21. An immersion lithographic apparatus comprising:

a projection system to project a beam of radiation onto a substrate supported by a substrate table; and a fluid handling structure configured to supply immersion liquid to a space defined between a projection system and a facing surface facing the fluid handling structure, wherein the fluid handling structure comprises:

a main body;

a moveable member moveable relative to the main body, the moveable member having an opening in the bottom surface for the passage therethrough of a fluid; and a mechanism to maintain a gap of a certain size between a bottom surface of the moveable member and the facing surface, the mechanism configured to provide a flow of fluid through the opening that creates an underpressure or overpressure, between the bottom surface and the facing surface, to generate a first force on the moveable member, the first force having a component in a first direction, and the mechanism configured to provide an underpressure or overpressure using the flow of fluid, in a chamber defined by at least in part by a surface of the moveable member, to generate a second force on the moveable member, the second force having a component in a second direction opposite to the first direction.

\* \* \* \* \*